(12) United States Patent
Matsuki

(10) Patent No.: US 9,893,029 B2
(45) Date of Patent: Feb. 13, 2018

(54) SEMICONDUCTOR DEVICE AND METHOD FOR MANUFACTURING THE SAME

(71) Applicant: FUJITSU SEMICONDUCTOR LIMITED, Yokohama-shi, Kanagawa (JP)

(72) Inventor: Hirohisa Matsuki, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/587,521

(22) Filed: Dec. 31, 2014

(65) Prior Publication Data
US 2015/0118841 A1    Apr. 30, 2015

Related U.S. Application Data

(62) Division of application No. 12/975,961, filed on Dec. 22, 2010, now Pat. No. 8,952,538.

(30) Foreign Application Priority Data

Dec. 25, 2009  (JP) ................................. 2009-294180

(51) Int. Cl.
*H01L 23/48*   (2006.01)
*H01L 23/52*   (2006.01)
(Continued)

(52) U.S. Cl.
CPC .............. *H01L 24/11* (2013.01); *H01L 24/03* (2013.01); *H01L 24/05* (2013.01); *H01L 24/13* (2013.01);
(Continued)

(58) Field of Classification Search
CPC . H01L 2224/05599; H01L 2924/00014; H01L 2924/10253; H01L 2924/00;
(Continued)

(56) References Cited

U.S. PATENT DOCUMENTS 6,465,886 B1   10/2002  Horiuchi et al.
6,538,326 B2   3/2003   Shimizu et al.
(Continued)

FOREIGN PATENT DOCUMENTS

CN   101599472 A   12/2009
JP   05-274947 A   10/1993
(Continued)

OTHER PUBLICATIONS

Chinese Office Action dated Oct. 30, 2012 corresponding to Chinese Application No. 201010620988.3 (with English translation).
(Continued)

*Primary Examiner* — Meiya Li
(74) *Attorney, Agent, or Firm* — Westerman, Hattori, Daniels & Adrian, LLP

(57) ABSTRACT

A semiconductor device includes: an integrated circuit having an electrode pad; a first insulating layer disposed on the integrated circuit; a redistribution layer including a plurality of wirings and disposed on the first insulating layer, at least one of the plurality of wirings being electrically coupled to the electrode pad; a second insulating layer having a opening on at least a portion of the plurality of wirings; a metal film disposed on the opening and on the second insulating layer, and electrically coupled to at least one of the plurality of wirings; and a solder bump the solder bump overhanging at least one of the plurality of wirings not electrically coupled to the metal film.

13 Claims, 7 Drawing Sheets

(51) Int. Cl.
*H01L 29/40* (2006.01)
*H01L 23/00* (2006.01)

(52) U.S. Cl.
CPC ............ *H01L 2224/0231* (2013.01); *H01L 2224/0347* (2013.01); *H01L 2224/0361* (2013.01); *H01L 2224/03912* (2013.01); *H01L 2224/03914* (2013.01); *H01L 2224/0401* (2013.01); *H01L 2224/05599* (2013.01); *H01L 2224/1147* (2013.01); *H01L 2224/1162* (2013.01); *H01L 2224/11462* (2013.01); *H01L 2224/11614* (2013.01); *H01L 2224/13022* (2013.01); *H01L 2224/13147* (2013.01); *H01L 2224/13155* (2013.01); *H01L 2224/16* (2013.01); *H01L 2924/00014* (2013.01); *H01L 2924/01004* (2013.01); *H01L 2924/014* (2013.01); *H01L 2924/01005* (2013.01); *H01L 2924/0105* (2013.01); *H01L 2924/01006* (2013.01); *H01L 2924/01012* (2013.01); *H01L 2924/01013* (2013.01); *H01L 2924/01014* (2013.01); *H01L 2924/01022* (2013.01); *H01L 2924/01024* (2013.01); *H01L 2924/01029* (2013.01); *H01L 2924/01033* (2013.01); *H01L 2924/01047* (2013.01); *H01L 2924/01078* (2013.01); *H01L 2924/01088* (2013.01); *H01L 2924/10253* (2013.01); *H01L 2924/14* (2013.01); *H01L 2924/2064* (2013.01); *H01L 2924/20101* (2013.01); *H01L 2924/20102* (2013.01); *H01L 2924/20103* (2013.01); *H01L 2924/20104* (2013.01); *H01L 2924/20105* (2013.01); *H01L 2924/20106* (2013.01)

(58) Field of Classification Search
CPC ... H01L 2224/0231; H01L 2224/03912; H01L 2224/0401; H01L 2224/11462; H01L 2224/1147; H01L 2224/11614; H01L 2224/1162
See application file for complete search history.

(56) References Cited

U.S. PATENT DOCUMENTS

| | | | |
|---|---|---|---|
| 6,872,589 | B2 | 3/2005 | Strandberg et al. |
| 2002/0043723 | A1 | 4/2002 | Shimizu et al. |
| 2003/0015342 | A1* | 1/2003 | Sakamoto .......... H01L 21/4846 174/250 |
| 2004/0191491 | A1 | 9/2004 | Sugaya et al. |
| 2006/0199302 | A1 | 9/2006 | Ito et al. |
| 2006/0263727 | A1* | 11/2006 | Lee ................... H01L 23/3114 430/311 |
| 2006/0267198 | A1 | 11/2006 | Lin et al. |
| 2008/0122082 | A1 | 5/2008 | Yamamoto et al. |
| 2008/0169539 | A1 | 7/2008 | Fang et al. |
| 2009/0092789 | A1* | 4/2009 | Tsuchida ................ B32B 15/08 428/141 |
| 2009/0096094 | A1* | 4/2009 | Tetani ................. H01L 23/3114 257/737 |
| 2009/0134527 | A1 | 5/2009 | Chang |
| 2010/0246152 | A1 | 9/2010 | Lin et al. |

FOREIGN PATENT DOCUMENTS

| | | |
|---|---|---|
| JP | 2001-24023 A | 1/2001 |
| JP | 2001-156172 A | 6/2001 |
| JP | 2002-198374 A | 7/2002 |
| JP | 2005-236318 A | 9/2005 |
| JP | 2008-135486 A | 6/2008 |
| JP | 2008-172232 A | 7/2008 |
| JP | 2009-177072 A | 8/2009 |

OTHER PUBLICATIONS

Japanese Office Action dated May 21, 2013, issued in corresponding Japanese Patent Application No. 2009-294180, with English translation (14 pages).

Chinese Office Action dated May 13, 2013 issued in corresponding Chinese Patent Application No. 201010620988.3 w/English translation.

* cited by examiner

SEMICONDUCTOR DEVICE AND METHOD FOR MANUFACTURING THE SAME

CROSS-REFERENCE TO RELATED APPLICATIONS

This application is a Divisional of copending Application Ser. No. 12/975,961 filed on Dec. 22, 2010, which claims the benefit of priority from Japanese Patent Application No. 2009-294180 filed on Dec. 25, 2009, the entire contents of which are incorporated herein by reference.

BACKGROUND

1. Field

Embodiments discussed herein relate to a semiconductor device and a method for manufacturing the semiconductor device.

2. Description of the Related Art

A wafer level packaging (WLP) technique for forming redistribution wirings and terminals in a wafer state may be applied to a flip-chip mounted semiconductor device including a plurality of protruding terminals arranged in an array.

The related art is disclosed, for example, in Japanese Laid-open Patent Publication Nos. 2002-198374 and 2008-135486.

SUMMARY

According to one aspect of the embodiments, a semiconductor device includes: an integrated circuit including an electrode pad; a first insulating layer disposed on the integrated circuit; a redistribution layer including a plurality of wirings and disposed on the first insulating layer, at least one of the plurality of wirings being electrically coupled to the electrode pad; a second insulating layer having an opening on at least a portion of the plurality of wirings; a metal film disposed on the opening and on the second insulating layer, and electrically coupled to at least one of the plurality of wirings; and a solder bump overhanging at least one of the plurality of wirings not electrically coupled to the metal film.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1A:
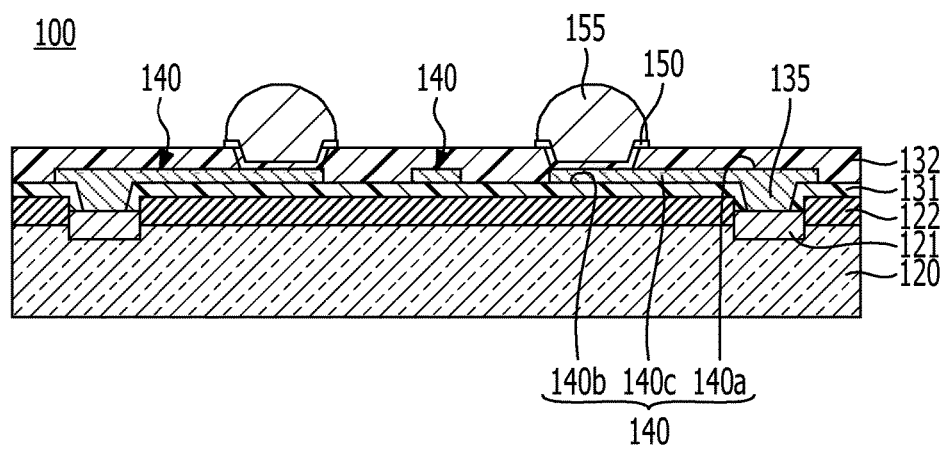
FIGS. 1A and 1B illustrate an exemplary semiconductor device.
Figure 1B:
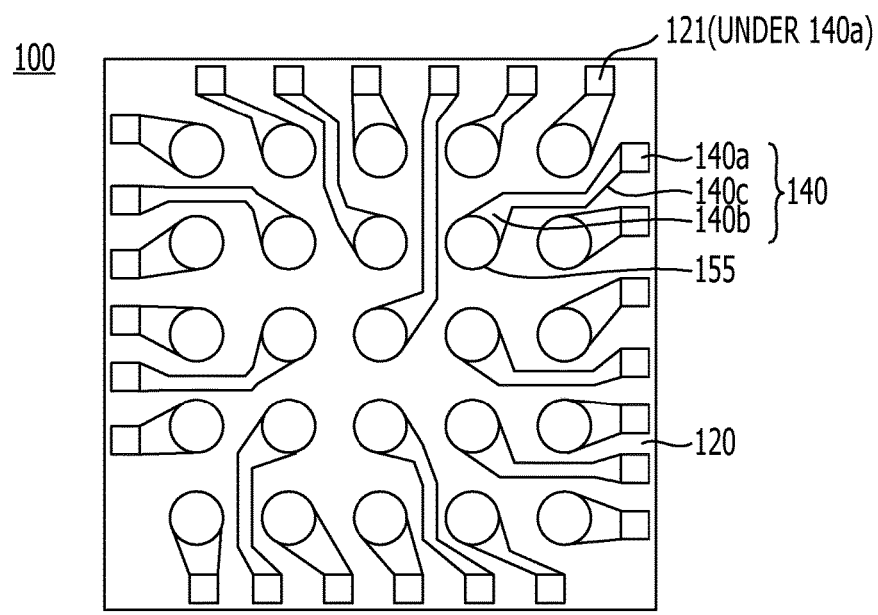

FIGS. 1A and 1B illustrate an exemplary semiconductor device. This semiconductor device may have a WLP structure. As illustrated in the sectional view of FIG. 1A, the semiconductor device 100 includes a semiconductor substrate 120, such as silicon (Si) wafer. The semiconductor substrate 120 includes transistors of a large-scale integrated (LSI) circuit. LSI terminals 121 and an insulating layer 122 made of, for example, silicon nitride (SiN) are formed on the semiconductor substrate 120. The insulating layer 122 has openings at positions aligned by the LSI terminals 121. A first insulating resin layer 131 is formed on the insulating layer 122 having openings at positions aligned by the LSI terminals 121. Redistribution wirings including copper (Cu) are formed on the first insulating resin layer 131, and conductor vias 135 which are filled with the Cu are formed. A second insulating resin layer 132 is formed on the first insulating resin layer 131 and the redistribution wirings 140. The second insulating resin layer 132 includes openings for exposing the redistribution wirings 140 at positions where external connection terminals of the semiconductor device 100 are formed. Solder bumps 155, or external connection terminals, may be electrically coupled to the redistribution wirings 140 through the openings. Each solder bump 155 may be electrically coupled to the redistribution wiring 140 via an under-bump metal film (UBM film) 150 serving as a barrier metal or the like. The LSI terminal 121 is electrically coupled to the solder bump 155 via the redistribution wiring 140.

FIG. 1B illustrates an exemplary layout of redistribution wirings 140 and solder bumps 155 of a semiconductor device 100. FIG. 1B may illustrate the semiconductor substrate 120, the redistribution wirings 140 and the solder bumps 155 illustrated in FIG. 1A.

The redistribution wirings 140 couple each of many LSI terminals 121 formed at a peripheral region on the surface of the semiconductor substrate 120 to at least one of the solder bumps 155 distributed on the top of the semiconductor device 100. Accordingly, the redistribution wiring 140 corresponding to the solder bump 155 located near the center of the top surface may include a first land portion 140a overlying the LSI terminal 121, and a second land portion 140b underlying the solder bump 155, and a wiring portion 140c extending between the first and second land portions 140a and 140b. The wiring portion 140c, which couples the second land portion 140b underlying the solder bump 155 located near the center to the first land portion 140a disposed in the outer region may be routed so as to run between the second land portions 140b of other redistribution wirings 140.

The number of the external connection terminals 155 illustrated in FIG. 1B may be 5×5=25 pins. The number of external connection terminals may be 400 pins or some other number. The wiring pitch indicating the sum of the width of the wiring portion 140c and the interval between the wiring portions may be reduced and many wiring portions 140c may be disposed between two adjacent second land portions 140b. The wiring pitch may only be reducible to a certain sum because of a design rule.

The diameter of the second land portion 140b may be reduced. The redistribution wirings 140, which are not connected to the UBM film, are provided at a space below the UBM film which is formed by reducing the diameter of the second land portion 140b. Many redistribution wirings 140 may be disposed between two adjacent second land portions 140b.

The UBM film 150 may shrink in a cooling operation of a reflow for forming the solder bump 155, and the second insulating resin layer 132 may be pulled by the shrinkage, thereby being delaminated from the redistribution wiring 140.

Elements illustrated in the drawings may not be illustrated with the same scales.

Figures 2A, 2B:
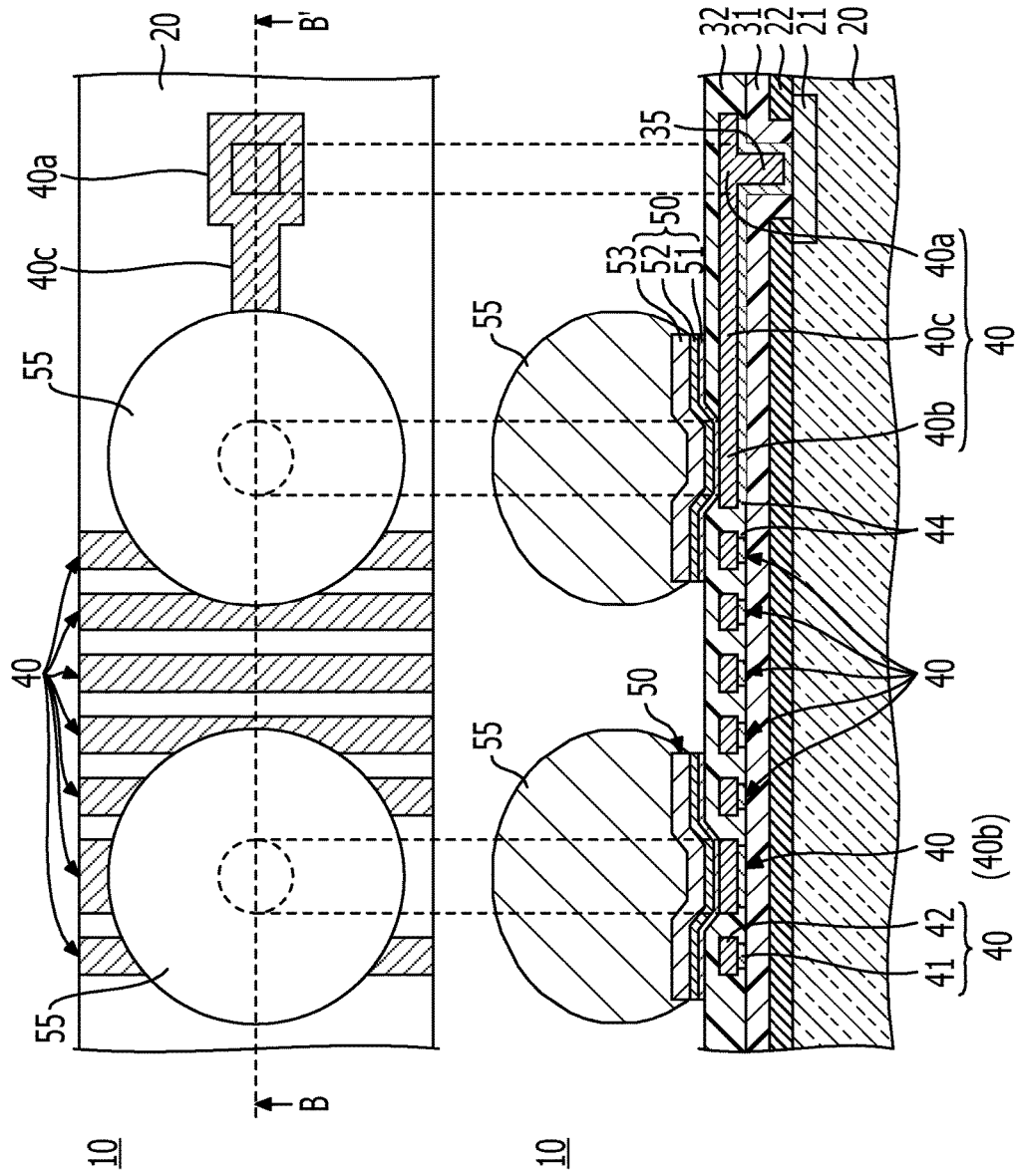
FIGS. 2A and 2B illustrate an exemplary semiconductor device.

FIGS. 2A and 2B illustrate an exemplary semiconductor device. FIG. 2A illustrates an upper surface of a part of the semiconductor device 10. FIG. 2B illustrates a cross section taken along line B-B' illustrated in FIG. 2A.

The semiconductor device 10 includes a semiconductor substrate 20, a first insulating layer 31, a second insulating layer 32, a conductor via 35 passing through the insulating layer 31, a redistribution layer 40, a metal layer including under-bump metal (UBM) films 50, and solder bumps 55. Other elements of the semiconductor device 10 may be omitted in FIG. 2A.

The semiconductor substrate 20 may include a Si wafer or a SOI (silicon on insulator) wafer, and a semiconductor integrated circuit, such as a LSI circuit, near the surface thereof. The semiconductor substrate may include a semiconductor wafer and a wiring structure including an integrated circuit and multilayer wirings formed on the semiconductor wafer. An electrode pad 21 of the integrated circuit and an uppermost insulating protective layer 22 are formed at the surface of the semiconductor substrate 20. The electrode pad 21 may include a metal, such as aluminum (Al), and the insulating protective layer 22 may include an inorganic compound, such as silicon nitride (SiN). The insulating protective layer 22 includes an opening for exposing the electrode pad 21. Although FIG. 2B illustrates one electrode pad 21, a plurality of electrode pads 21 may be formed on the surface of the semiconductor substrate 20. The electrode pads 21 may be disposed along the edge of the semiconductor substrate 20, like the first land portions 140*a* of the redistribution wirings illustrated in FIG. 1B. Some of the electrode pads 21 may be disposed in the central region of the semiconductor substrate 20, or may be arranged in another layout.

The solder bumps 55 may be external connection terminals of the semiconductor device 10. The solder bumps 55 may be coupled to connection pads of a circuit board of a mother board of an electronic apparatus by flip-chip mounting. When the semiconductor device 10 is mounted on a different semiconductor device in a chip-on-chip manner, the solder bumps 55 may be coupled to connection pads of the different semiconductor device. Although FIGS. 2A and 2B illustrate two solder bumps 55, many solder bumps 55 may be arranged in an array on the semiconductor device 10. The solder bumps 55 may include a solder material, such as Sn—Ag, Sn—Cu, or Sn—Ag—Cu.

When two semiconductor devices are mounted in a chip-on-chip manner, one of the semiconductor devices may be the semiconductor device 10, and the other may be a different semiconductor device not having the solder bumps 55.

The redistribution layer 40 includes a plurality of redistribution wirings coupling the respective electrode pads 21 to the corresponding solder bumps 55. The redistribution wirings of the redistribution layer 40 are indicated by reference numeral 40. The redistribution wiring may couple two or more electrode pads to one solder bump, or may couple one electrode pad to two or more solder bumps. The redistribution wiring 40 includes a first land portion 40*a* coupled to the electrode pad 21 of the integrated circuit, a second land portion 40*b* coupled to the solder bump 55, and a wiring portion 40*c* coupling the first land portion 40*a* to the second land portion 40*b*.

The redistribution layer 40 is disposed between the first insulating layer 31 and the second insulating layer 32. The first land portion 40*a* is electrically coupled to the electrode pad 21 of the integrated circuit through the conductor via 35 formed in the opening of the first insulating layer 31. The second land portion 40*b* is electrically coupled to the solder bump 55 through the metal (UBM) film 50 formed in the opening of the second insulating layer 32.

The UBM film 50 may include a barrier metal disposed at the joint between the solder bump 55 and the redistribution layer 40. Since the UBM film 50 spreads from the inside of the opening in the second insulating layer 32 to the surface of the second insulating layer 32 around the opening, the solder bump 55 may have a larger diameter than that of the opening. The solder bump 55 may be coupled to the second land portion 40*b* having a smaller diameter than the diameter of the bump 55 through the UBM film 50. A size of the second land portion 40*b* coupled to the solder bump 55 is reduced, and a space for passing the redistribution wirings 40 not coupled to the bump 55, for example, a wiring portion 40*c* may be formed under the UBM film 50 and the solder bump 55.

For example, the solder bump 55 and UBM film 50 may be arranged at a pitch of 300 μm, the UBM film 50 may have a diameter of 150 μm, and the redistribution wirings 40 may be arranged at a pitch of 30 μm (L/S=15/15 μm). When the second land portion 40*b* has substantially the same diameter as the diameter of the UBM film 50, for example, about 150 μm, other redistribution wirings 40 may not be provided under the UBM film 50. Other four redistribution wirings 40 may be provided in the space of about 150 μm between two adjacent second land portions 40*b*. For example, when the second land portion 40*b* has a diameter of 100 μm, six redistribution wirings 40 may be provided in the space of 200 μm between two adjacent second land portions 40*b* since the second land portion 40*b* is coupled to the UBM film 50 with a joint smaller than or equal to the diameter of the second land portion 40*b*.

Since a plurality of the redistribution wirings 40 are disposed under a single UBM film 50 or solder bump 55, for example, a single solder bump 55 overhangs a plurality of redistribution wirings 40, a number of columns or rows of solder bumps may increase.

The two UBM films 50 and solder bumps 55 illustrated in FIGS. 2A and 2B overhang a plurality of redistribution wirings 40. Some of the UBM films and solder bumps of a semiconductor device may not overhang redistribution wirings not coupled thereto according to the layout of the LSI terminals and solder bumps or the positions of the UBM films and solder bumps.

The redistribution layer 40 may include a first conductive layer 41 formed on the first insulating layer 31 and a second conductive layer 42 formed on the first conductive layer 41. For example, the second conductive layer 42 may include Cu, which is a metal having a low resistivity, and may be formed by electroplating so as to have a thickness of 1 to 7 μm. The first conductive layer 41 may include a metal serving as a Cu diffusion barrier, or a metal enhancing the adhesion of the redistribution wirings 40 to the first insulating layer 31. For example, the first conductive layer 41 may include titanium (Ti) or chromium (Cr) and is formed by sputtering so as to have a thickness of 0.1 to 0.5 μm. The first conductive layer 41 may include a Cu layer which has a thickness of, for example, 0.1 μm and is formed on the Ti or Cr layer by sputtering. The Cu layer formed by sputtering may have a higher adhesion to the Ti or Cr layer than a plating Cu. The first conductive layer 41 may be formed by other methods such as chemical vapor deposition (CVD).

The second conductive layer 42 may have a center line average surface roughness (Ra) of about 100 nm or more, such as about 150 nm or 200 nm, at all or part of the joint surface with the second insulating layer 32. Tables 1 and 2 indicate the comparison between second conductive layers 42 having a surface roughness Ra of about 100 nm and second conductive layers 42 having a surface roughness Ra of about 40 nm. After forming the solder bumps 55, for example, after the completion of the semiconductor device 10 and after mounting the device on a wiring board, the cross sections when delaminating from the second conductive layers are observed as illustrated in Table 1, and the adhesion was measured as illustrated in Table 2. Table 1 indicates the number of samples which is delaminated when 20 samples were tested. Table 2 indicates the average adhesion of five samples. As illustrated in Tables 1 and 2, after forming the solder bumps, the delamination, when a surface roughness Ra is within the range of 40 to 100 nm, is not occurred and an average adhesion of about 1.7 N is obtained. For example, a surface roughness Ra of 40 nm or more ensures an adhesion of the redistribution wiring of the semiconductor device 10. After mounting on the wiring board by reflowing, delamination occurred in three of the samples having a surface roughness Ra of 40 nm, and their average adhesion was reduced to about 1.2 N. The samples having a surface roughness Ra of 100 nm does not cause delamination, and ensures a sufficient average adhesion of about 1.6 N.

TABLE 1

| Surface roughness | Delamination occurrence after bump formation | Delamination occurrence after mounting on board |
| --- | --- | --- |
| 40 nm | 0/20 | 3/20 |
| 100 nm | 0/20 | 0/20 |

TABLE 2

| Surface roughness | Adhesion after bump formation | Adhesion after mounting on board |
| --- | --- | --- |
| 40 nm | 1.67 N | 1.13 N |
| 100 nm | 1.72 N | 1.61 N |

By forming a second conductive layer 42 having a center line average surface roughness Ra of 100 nm or more, an anchor effect is produced between the redistribution wirings 40 and the second insulating layer 32 to reduce the occurrence of delamination between the redistribution wirings 40 and the second insulating layer 32 after mounting on a wiring board. The center line average surface roughness Ra may be 100 nm or more, and may be 500 nm or less from the viewpoint of reducing the dielectric breakdown or cracks in the second insulating layer 32.

In the redistribution layer 40, the patterned portion of the first conductive layer 41 is smaller than the patterned portion of the second conductive layer 42. Thus an under-cut region 44 is formed under the second conductive layer in such a manner that the side surfaces of the patterned portion of the first conductive layer 41 retreat toward the inner side of the patterned portion of the second conductive layer 42. Consequently, an insulating material applied to form the second insulating layer 32 flows into the under-cut regions, thereby enhancing the anchor effect between the redistribution wirings 40 and the second insulating layer 32. For example, the under-cut region 44 having a retreated amount of about 2 μm may be formed. Such retreat may enhance the anchor effect to reduce the occurrence of delamination between layers.

For example, the UBM film 50 may include a first conductive layer 51, a second conductive layer 52 and a third conductive layer 53 in that order from the second insulating layer 32 to the solder bump 55. The first conductive layer 51 of the UBM film 50 may include a metal having high barrier properties and high adhesion to the second insulating layer 32, such as Ti or Cr, and be formed so as to have a thickness of 0.1 to 0.5 μm by sputtering, for example. The second conductive layer 52 may include a metal having high adhesion to the first conductive layer 51, such as Cu, and be formed so as to have a thickness of 0.1 to 0.5 μm by sputtering or CVD, for example. The first conductive layer 51 and the second conductive layer 52 may include substantially the same material as the first conductive layer 41 of the redistribution layer 40. The third conductive layer 53 of the UBM film 50 may include a metal having high wettability to the solder of the solder bump 55, such as Ni, and be formed so as to have a thickness of 1 to 5 μm by electroplating, for example.

If the third conductive layer 53 includes a Ni layer, the second conductive layer 52, which includes a Cu layer having a thickness of 1 μm or more, may be formed. The Cu layer has a relatively high Young's modulus. Accordingly, by forming the second conductive layer 52 having a thickness of 1 μm or more, the shrinkage stress resulting from the recrystallization of the Ni third conductive layer 53 or the like may be absorbed by the deformation of the second conductive layer 52. The third conductive layer 53 may include a Cu coating formed by plating in order to reduce the effect of the recrystallization of the Ni layer.

The thickness of the first insulating layer 31 may be, for example, 2 to 7 μm, and the thickness of the second insulating layer 32 depends on the thickness of the redistribution layer 40 and may be, for example, 3 to 10 μm. The thickness of the second insulating layer 32 overlying the redistribution wiring 40 may be 3 μm or more. Since the UBM film 50 is disposed with a distance of 3 μm or more from the redistribution wiring 40, which underlies the UBM film 50 and is not couple to the UBM film 50, electrical short-circuiting between the UBM film 50 and the redistribution wirings 40 may be reduced. Since the second insulating layer 32 has a thickness of 3 μm or more, the stress caused by the thermal shrinkage of the UBM film 50 and/or the solder bump 55 may be alleviated in the second insulating layer 32, thereby reducing the stress applied on the interface between the second insulating layer 32 and the redistribution wiring 40.

The first insulating layer 31 and the second insulating layer 32 may include the same material or a different material. The first insulating layer 31 and the second insulating layer 32 may include an insulating resin, such as polyimide or phenol resin.

The second insulating layer 32 may include an insulating resin cured at a temperature of 300° C. or less, such as 200° C. The second insulating layer 32 may include a resin cured at a low temperature. Since such a second insulating layer 32 may be cured at a low temperature, the expansion or shrinkage stress that may be caused by curing the second insulating layer 32 and remain between the second insulating layer 32 and the redistribution wirings 40 may be reduced. Consequently, the delamination between the second insulating resin layer 32 and the redistribution layer 40 may be reduced. Also, since the second insulating layer 32 is cured at a low temperature, the thickness reduction of the second insulating resin layer 32 that may be caused by curing may be alleviated. Therefore, electrical short-circuiting and cracks of the second insulating layer 32 at the edges of the redistribution wirings 40 may be reduced. The insulating resin cured at a low temperature may include a phenol resin. For example, WPR series available from JSR are cured at 200° C. or less. The second insulating layer 32 may include a composite material including a phenol resin and an elastic material, such as a rubber material. Such a second insulating layer 32 may highly absorb stress and may reduce the stress applied on the interfaces between the second insulating layer 32 and the redistribution wirings 40.

The second insulating layer 32 may include polyimide having a high adhesion to Cu.

FIGS. 3A to 5C illustrate a manufacturing process of a semiconductor device. The semiconductor device 10 illustrated in FIG. 2 may be manufactured in the manufacturing process illustrated in FIGS. 3A to 5C.

Figure 3A:
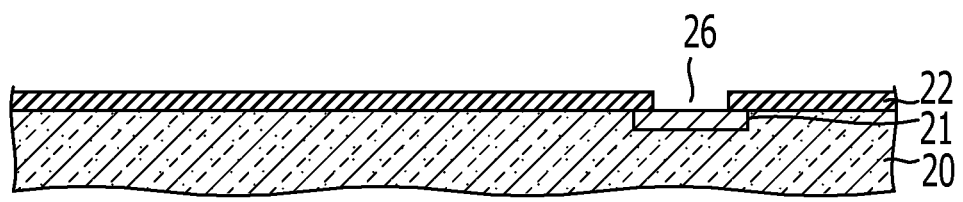
FIGS. 3A to 3C illustrate an exemplary method for manufacturing a semiconductor device.

As illustrated in FIG. 3A, an insulating protective layer 22 having an opening 26 where an electrode pad 21 is exposed is formed on the surface of a semiconductor substrate 20. In the semiconductor substrate 20, a semiconductor integrated circuit, such as an LSI circuit, is formed. The electrode pad 21 is formed at the top of the semiconductor substrate 12, and may include, for example, Al. The insulating protective layer 22 may include an inorganic material, such as SiN, and be formed on the surface of the semiconductor substrate 20 so as to have a thickness of, for example, 5 μm. The opening 26 is formed in the insulating protective layer 22 by photolithography.

Figure 3B:
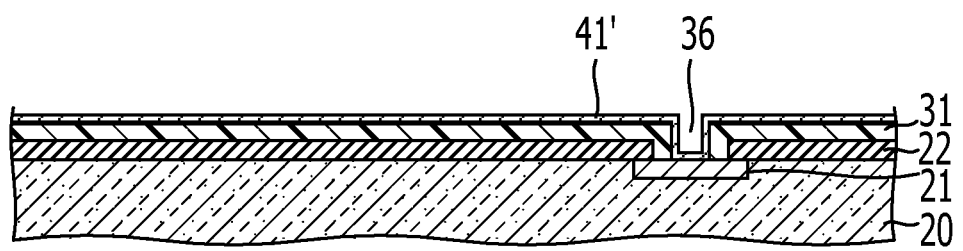

Turning to FIG. 3B, a first insulating layer 31 having an opening 36 on the electrode pad 21 is formed, and a conductive layer 41' is formed on the first insulating layer 31 and in the opening 36. For example, the first insulating layer 31 including an insulating material, such as polyimide or phenol resin, is formed by spin coating, and the opening 36 is formed by photolithography. Alternatively, the first insulating layer 31 having the opening 36 may be formed by printing. The conductive layer 41' may be formed, for example, by forming a Ti or Cr layer having a thickness of 0.1 to 0.5 μm by sputtering, and subsequently forming a Cu layer having a thickness of 0.1 μm by sputtering. Such a multilayer conductive layer 41' may enhance the adhesion to the underlying first insulating layer 31 and the coating layer formed on the underlying first insulating layer 31. This operation may be performed by CVD instead of sputtering.

Figure 3C:
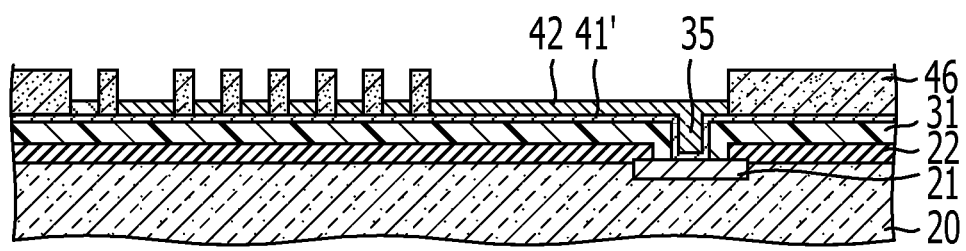

Turning to FIG. 3C, a resist pattern 46 is formed, and then, a Cu coating 42 having a thickness of, for example, 5 μm is formed by plating. A periodic pulse reverse (PPR) method may be applied in order to improve a control of the surface of the coating 42. An additive may be added to the plating bath in order to roughen the surface of the Cu coating 42. For example, chlorine (Cl) and/or polyacrylamide (PM) may be added to an aqueous solution of copper sulfate. Table 3 illustrates an exemplary recipe for PPR method.

TABLE 3

| Bath composition | Standard | Appropriate range |
| --- | --- | --- |
| Copper sulfate pentahydrate | 90 g/L | 50-130 g/L |
| Chlorine ion | 70 mg/L | 60-80 mg/L |
| PPR-C | 5 mL/L | 4-8 mL/L |
| PPR-A conc. | 0.2 mL/L | 0.1-0.3 mL/L |

The center line average surface roughness Ra of the Cu coating 42 may be controlled to 100 nm or more, such as 150 nm or 200 nm by controlling the additive contents to appropriate ranges. A Cu coating 42 having a surface roughness Ra of 100 nm or more may reduce the delamination of the second insulating layer from the Cu coating 42 (anchor effect).

Figure 4A:
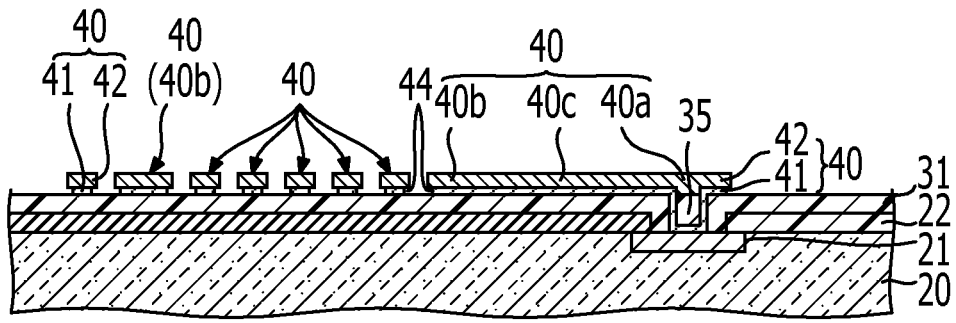
FIGS. 4A to 4C illustrate an exemplary method for manufacturing a semiconductor device.

Turning to FIG. 4A, the resist pattern 46 is removed, and then the conductive layer 41' is etched using the Cu coating 42 as a mask. A plurality of redistribution wirings 40 including a first conductive layer 41 and a second conductive layer 42 and a conductor via 35, which couples the redistribution wiring 40 (first land portion 40a) to the electrode pad 21, are formed. If, for example, the conductive layer 41' includes a Ti layer and a Cu layer, the Cu layer may be etched with an etchant including acetic acid or ammonia and hydrogen peroxide, and the Ti layer may be etched with hydrofluoric acid. At least the Ti layer may be over-etched so that under-cut regions 44, where the Ti layer 41 is retreated toward the inner direction of the pattern of the Cu coating 42, is formed. The width of the under-cut region 44, for example, the retreat amount of the Ti layers 41 with respect to the pattern of the Cu coating 42, may be 2 μm. The under-cut regions 44 may reduce the delamination of a second insulating layer from the redistribution wirings 40 (anchor effect).

The roughing process of the Cu coating 42 may include other chemical process in addition to or instead of the control of the additive content in the plating bath. For example, chemical process performed after the removal of the resist pattern 46 may increase the surface roughness Ra of the Cu coating 42.

Figure 4B:
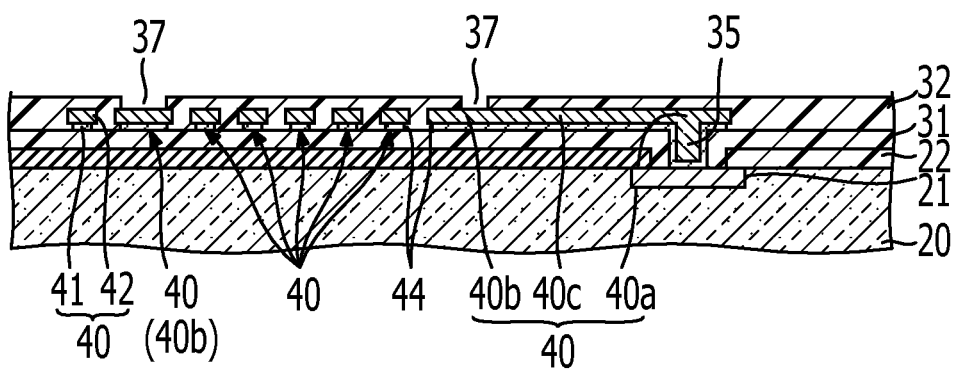

Turning to FIG. 4B, a second insulating layer 32 having openings 37 on the second land portions 40b of the redistribution wirings 40 is formed. For example, the second insulating layer 32, which includes substantially the same insulating resin as the first insulating layer 31, such as polyimide or phenol resin, is formed by spin coating, and subsequently the openings 37 are formed by photolithography. The portions of the second insulating layer 32 overlying the redistribution wirings 40 may have a thickness of 3 μm or more. For example, if the redistribution wiring 40 includes a Ti or Cr layer having a thickness of 0.1 to 0.5 μm by sputtering, a Cr layer formed to a thickness of 0.1 μm, which is also formed by sputtering, and a Cu coating having a thickness of 5 μm, which is formed by plating, a second insulating layer 32 having a thickness of 10 μm may be formed. The second insulating layer 32 may include an insulating resin, which is cured at a temperature of 300° C. or less, such as 200° C. or less, in order to alleviate residual stress or the thickness reduction of the second insulating layer 32.

Figure 4C:
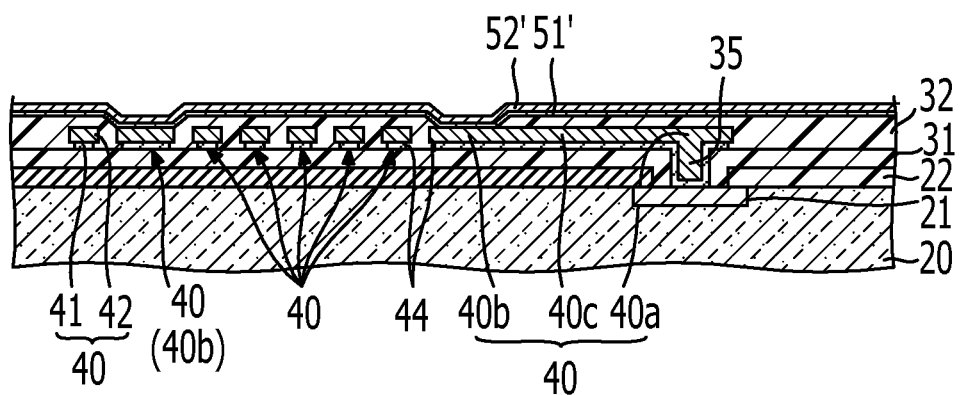

After the second insulating layer 32 is cured, conductive layers 51' and 52' are formed, as illustrated in FIG. 4C. The conductive layers 51' and 52' may include a Ti or Cr layer and a Cu layer, respectively, formed by sputtering, similar to the layers of the first conductive layer 41 of the redistribution wiring 40. When a Ni layer is formed over the conductive layer 52', the conductive layer 52' may include a Cu layer having a thickness of 1 μm or more to absorb the shrinkage stress of the Ni layer.

Figure 5A:
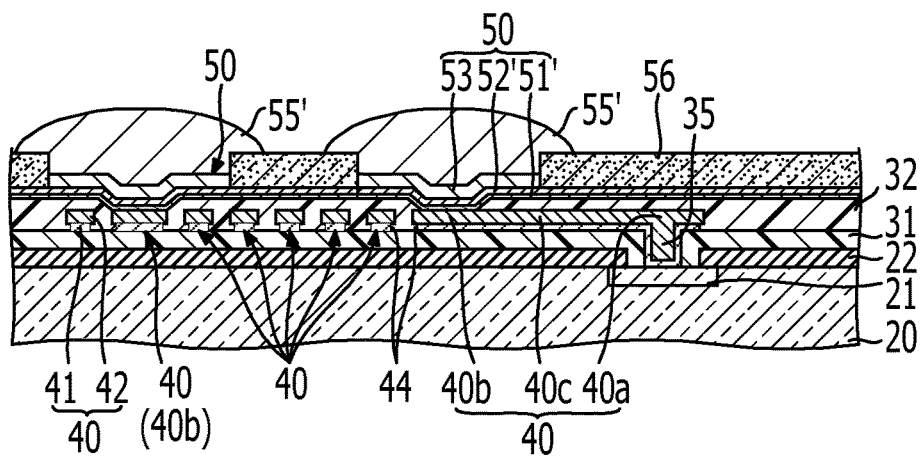
FIGS. 5A to 5C illustrate an exemplary method for manufacturing a semiconductor device.

Turning to FIG. 5A, after a resist pattern 56 is formed, a conductive layer 53 and solder portions 55' are formed by electroplating. The conductive layer 53' may include a Ni layer. The conductive layer 53' may include a Cu layer in replace of the Ni layer in order to reduce the effect of the thermal shrinkage of the conductive layer 53' on the second insulating layer 32.

Figure 5B:
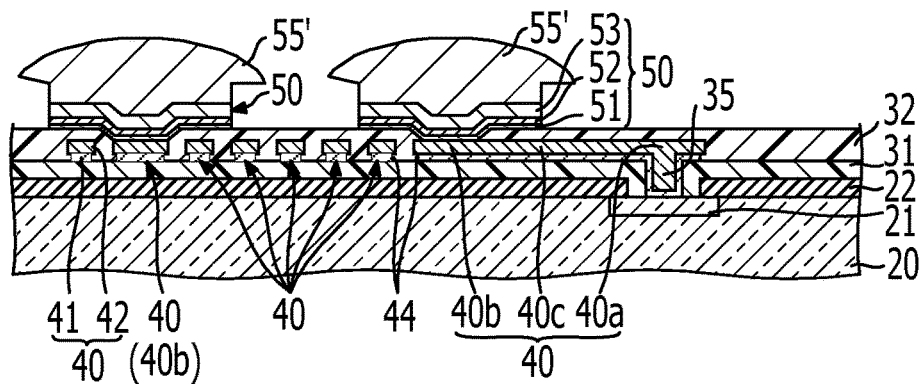

Turning to FIG. 5B, after the resist pattern 56 is removed, the exposed conductive layer 52' and the exposed conductive layer 51' are removed by etching. Thus UBM films 50 are formed including the conductive layers 51, 52 and 53.

Figure 5C:
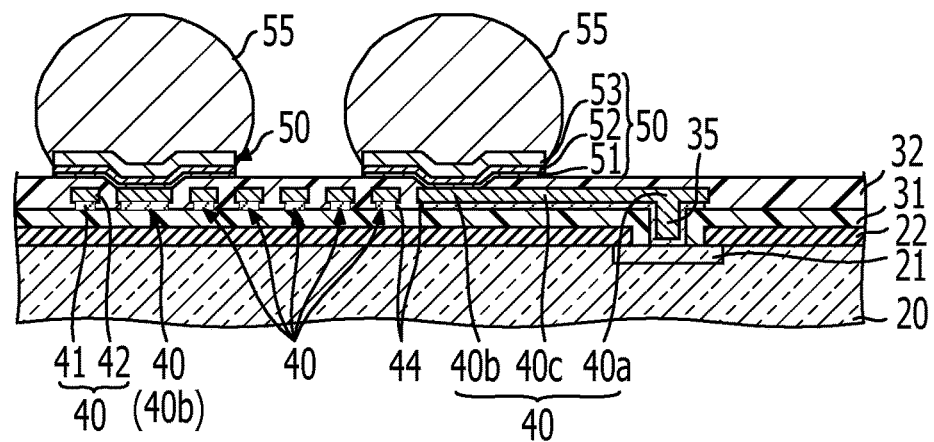

Turning to FIG. 5C, the solder portions 55' are reflowed into solder bumps 55. The semiconductor device 10 illustrated in FIG. 2 is thus formed.

The formation of the solder portions 55' illustrated in FIG. 5A and the reflowing illustrated in FIG. 5C may be omitted. The semiconductor device, which includes external connection pads to be coupled to solder bumps of another semiconductor device in a chip-on-chip manner, may be manufactured.

FIGS. 6A, 6B, 7A and 7B illustrate an exemplary method for manufacturing a semiconductor device. The descriptions of elements, which are the same as or similar to elements of the semiconductor device 10 illustrated in FIGS. 2A and 2B, may be omitted in FIGS. 6A to 7B.

Figures 6A, 6B:
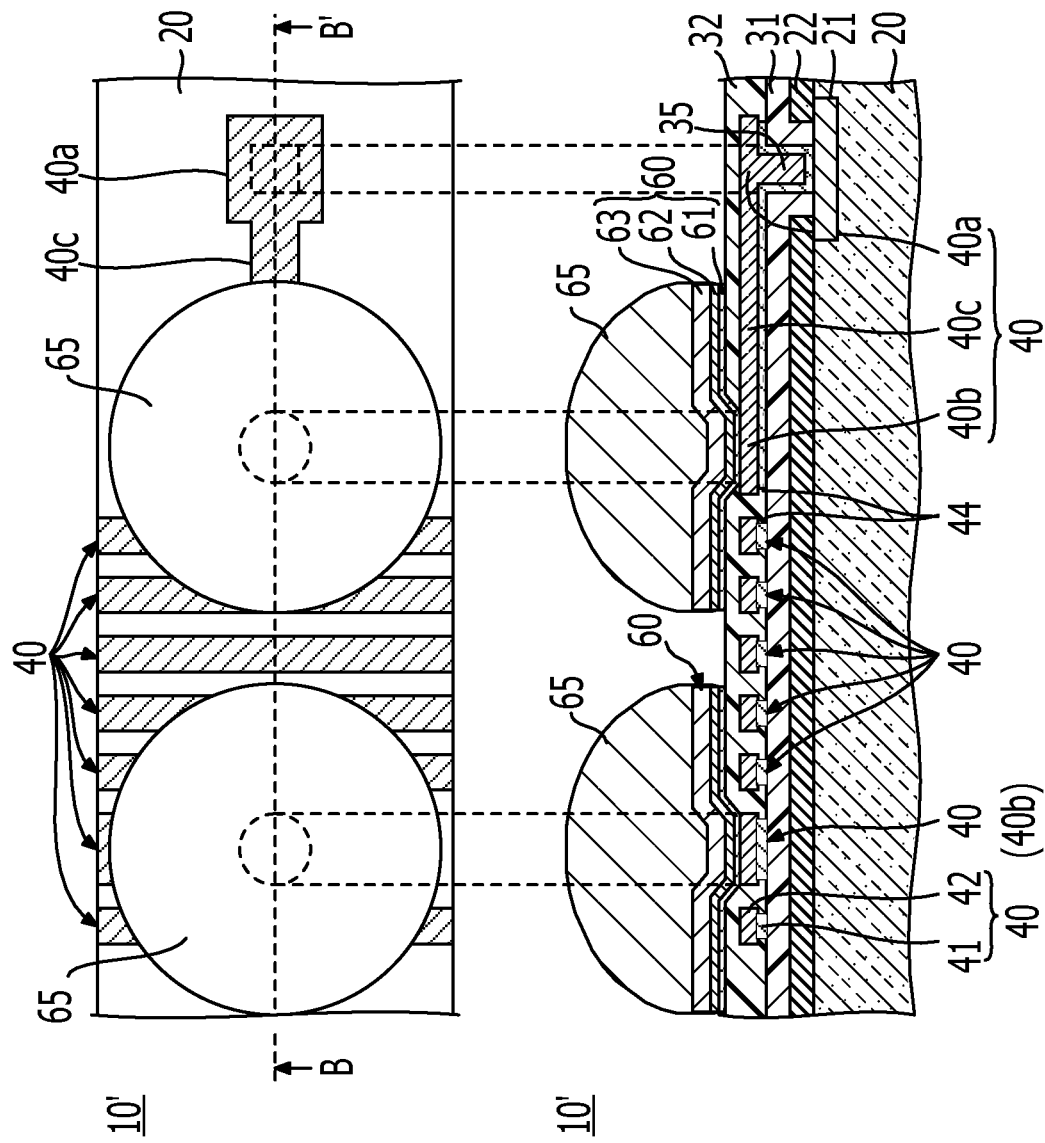
FIGS. 6A and 6B illustrate an exemplary method for manufacturing a semiconductor device.

FIG. 6A illustrates part of the upper surface of a semiconductor device 10'. FIG. 6B illustrates a section taken along line B-B' illustrated in FIG. 6A.

The semiconductor device 10' includes UBM films 60 and solder bumps 65 that overhang more redistribution wirings 40 than those of the semiconductor device 10 illustrated in FIGS. 2A and 2B. A number of redistribution wirings 40 not electrically coupled to the UBM film or the solder bump under the UBM film 60 and solder bump 65 may be arbitrary. The UBM films 60 each include first, second and third conductive layers 61, 62 and 63. The conductive layers 61, 62 and 63 may include similar materials to or substantially the same materials as materials of the conductive layers 51, 52 and 53 of the semiconductor device 10, respectively.

In FIGS. 6A and 6B, the UBM films 60 and the solder bumps 65 may be indicated to have larger diameter than that of the UBM films 50 and solder bumps 55 of the semiconductor device 10 illustrated in FIGS. 2A and 2B. The UBM film 60 and the solder bump 65 of the semiconductor device 10' may be smaller than or substantially equal to those of the semiconductor device 10 illustrated in FIGS. 2A and 2B. The redistribution wirings of the semiconductor device 10' are arranged at a pitch smaller than or substantially equal to the pitch of the semiconductor device 10 illustrated in FIGS. 2A and 2B.

Figure 7A:
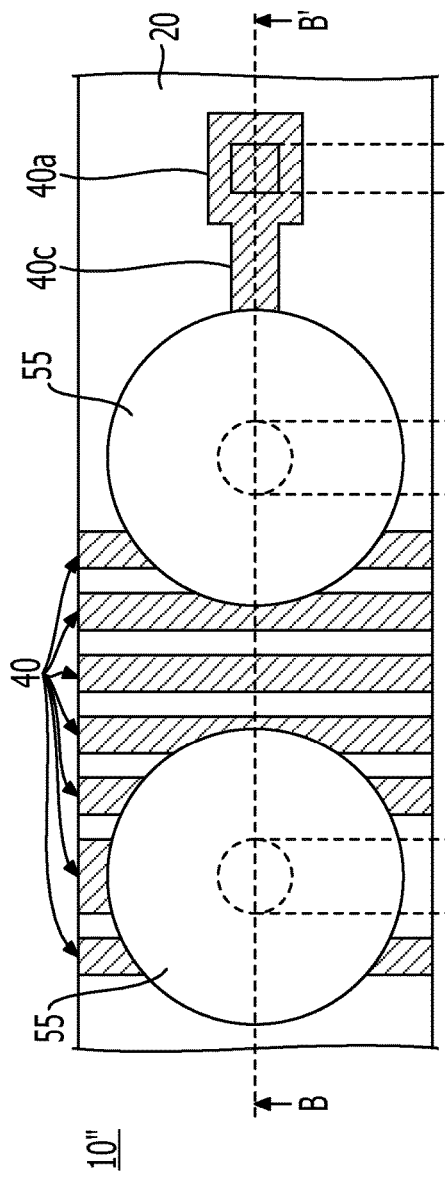
FIGS. 7A and 7B illustrate an exemplary method for manufacturing a semiconductor device.
Figure 7B:
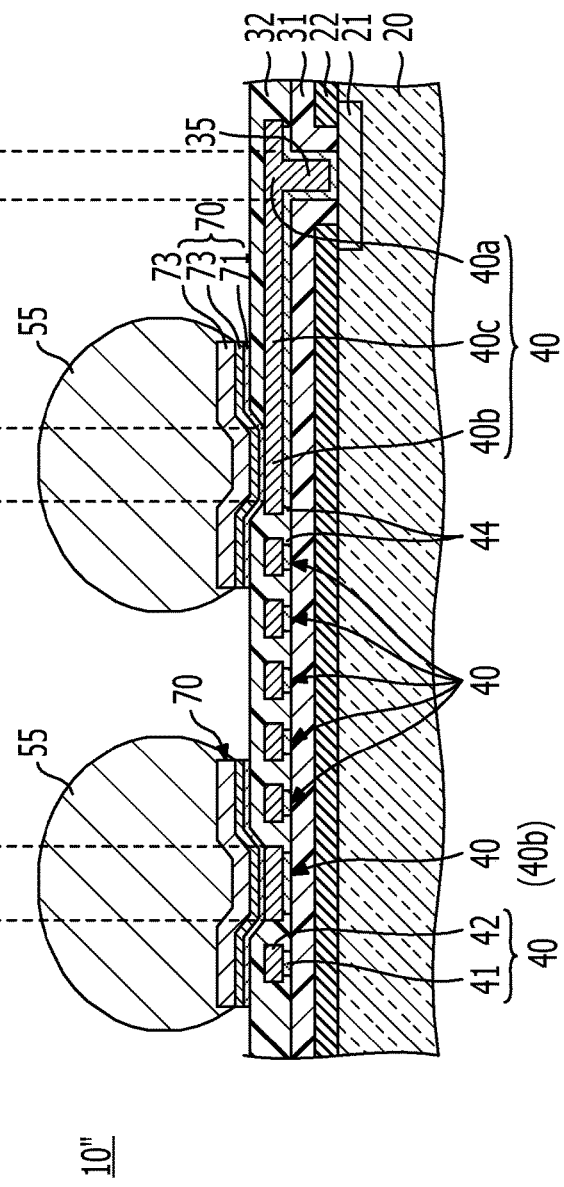

FIG. 7A illustrates part of the upper surface of a semiconductor device 10". FIG. 7B illustrates a section taken along line B-B' illustrated in FIG. 7A.

The semiconductor device 10" includes UBM films 70 instead of the UBM films 50 of the semiconductor device 10 illustrated in FIGS. 2A and 2B. The UBM films 70 each include first, second and third conductive layers 71, 72 and 73 that include similar materials to or substantially the same materials as materials of the conductive layers 51, 52 and 53 of the semiconductor device 10, respectively. The semiconductor device 10" may include non-solder mask defined (NSMD) pads to be used for a wiring board at the respective joints of the UBM films 70 with the second land portions 40b of the redistribution wirings 40. For example, the opening for providing an external connection terminal in the second insulating layer 32 may be formed so as to overlie the second land portion 40b of the redistribution wiring 40 and the adjacent portion of the first insulating layer 31 not covered with the second land portion 40b. For example, the opening may be formed so as to expose at least one side surface of the second land portion 40b. The UBM film 70 is coupled to at least one side surface of the second land portion 40b.

The adhesion between the second land portion 40b and the UBM film 70 may be enhanced when the size of the second land portion 40b is reduced. When the size of the second land portion 40b is further reduced, for example, when the diameter or width of the second land portion 40b is reduced to be substantially the same as the width of the wiring portion 40c, a space in which another redistribution wiring 40 is disposed may be provided under the UBM film 70.

In FIG. 7B, the shapes of the second and third conductive layers 72 and 73 of the UBM film 70 may be maintained the same as those of the UBM film 50 illustrated in FIG. 2B, and the shape of lowermost conductive layer 71 of the UBM layer 70 is altered. Each conductive layer of the UBM film 70 may be formed in any shape. For example, the shapes of the second conductive layer 72, the third conductive layer 73 and the solder bump 55 may be selected according to the width or diameter of the second land portion 40b of the redistribution wiring 40 or the diameter of the opening formed in the second insulating layer 32.

Example embodiments of the present invention have now been described in accordance with the above advantages. It will be appreciated that these examples are merely illustrative of the invention. Many variations and modifications will be apparent to those skilled in the art.

The invention claimed is:

1. A method for manufacturing a semiconductor device, comprising: forming a first insulating layer on a substrate, the substrate including an electrode pad, the first insulating layer including a first opening on the electrode pad;
    forming, a first wiring that is electrically coupled to the electrode pad, at least one second wiring on the first insulating layer, and a third wiring on the first insulating layer;
    forming a second insulating layer that includes a second opening on a portion of the first wiring and that includes a third opening on a portion of the third wiring;
    forming a first metal film in the second opening and on the second insulating layer, the first metal film being electrically coupled to the first wiring and overhanging the first wiring and the at least one second wiring; and
    forming a second metal film in the third opening and on the second insulating layer, the second metal firm being electrically coupled to the third wiring,
    wherein the at least one second wiring is separated from the first metal film,
    the at least one second wiring is located between the first wiring and the third wiring in the plan view,
    the first wiring is extended in a first direction in the plan view, and
    each of the third wiring and the at least one second wiring is extended in a second direction different from the first direction in the plan view.

2. The method according to claim 1, wherein each of the first wiring, the at least one second wiring, and the third wiring has a center line average surface roughness of 100 nm or more.

3. The method according to claim 1, further comprising:
    forming a first solder bump on the first metal film so as to overhang at least one of the first wiring and the at least one second wiring.

4. The method according to claim 1, wherein forming the first wiring, the at least one second wiring, and the third wiring includes:
- forming a first conductive layer on the first insulating layer;
- forming a second conductive layer on the first conductive layer; and
- etching the first conductive layer using the second conductive layer as a mask so that a pattern of the first conductive film is smaller than a pattern of the second conductive film.

5. The method according to claim 1, wherein: forming the first wiring, the at least one second wiring, and the third wiring includes:
- forming a first conductive layer on the first insulating layer; and
- forming a second conductive layer, that has a center line average surface roughness of 100 nm or more, on the first conductive layer by electroplating.

6. The method according to claim 5,
wherein the second conductive layer includes copper,
wherein forming the second conductive layer includes performing the electroplating in a plating bath, the plating bath including a copper sulfate aqueous solution, and
wherein the copper sulfate aqueous solution includes at least one of chlorine and polyacrylamide as an additive content.

7. The method according to claim 1, wherein the second insulating layer is cured at a temperature of 200° C. or less.

8. The method according to claim 1,
wherein each of the first metal film and the second metal film includes a copper layer and a nickel layer formed on the copper layer, and
wherein the copper layer has a thickness of 1 µm or more.

9. The method according to claim 1, wherein the first direction is perpendicular to the second direction.

10. The method according to claim 1, wherein each of the first wiring and the third wiring is wider than the at least one second wiring.

11. The method according to claim 1, wherein forming the first wiring, the at least one second wiring, and the third wiring includes:
- forming a fourth wiring on the first insulating layer, the fourth wiring is extended in the second direction in the plan view, and the third wiring is located between the at least one second wiring and the fourth wiring in the plan view.

12. The method according to claim 11, further comprising:
- forming a first solder bump on the first metal film and a second solder bump on the second metal film,
wherein the at least one second wiring is formed in a plurality,
the first solder bump overhangs at least first one of the second wirings and the first wiring, and
the second solder bump overhangs at least second one of the second wirings and the fourth wiring.

13. The method according to claim 11, wherein each of the first wiring and the third wiring is wider than each of the at least one second wiring and the fourth wiring.

* * * * *